(12) United States Patent  
Worfolk et al.

(10) Patent No.: US 9,431,612 B2  
(45) Date of Patent: Aug. 30, 2016

(54) METHODS FOR TAILORING ELECTRODE WORK FUNCTION USING INTERFACIAL MODIFIERS FOR USE IN ORGANIC ELECTRONICS

(75) Inventors: Brian Worfolk, Edmonton (CA); Qun Chen, Edmonton (CA); Jillian Buriak, Edmonton (CA)

(73) Assignees: The Governors of the University of Alberta, Edmonton (CA); National Research Council of Canada, Ottawa (CA)

( * ) Notice: Subject to any disclaimer, the term of this patent is extended or adjusted under 35 U.S.C. 154(b) by 0 days.

(21) Appl. No.: 14/131,264

(22) PCT Filed: Jun. 21, 2012

(86) PCT No.: PCT/CA2012/000614  
§ 371 (c)(1),  
(2), (4) Date: Nov. 18, 2014

(87) PCT Pub. No.: WO2013/006946  
PCT Pub. Date: Jan. 17, 2013

(65) Prior Publication Data  
US 2015/0072446 A1    Mar. 12, 2015

Related U.S. Application Data

(60) Provisional application No. 61/505,830, filed on Jul. 8, 2011.

(51) Int. Cl.  
*H01L 51/40* (2006.01)  
*H01L 51/00* (2006.01)  
*H01L 51/44* (2006.01)  
*B82Y 10/00* (2011.01)  
*H01L 51/42* (2006.01)

(52) U.S. Cl.  
CPC .......... *H01L 51/0021* (2013.01); *B82Y 10/00* (2013.01); *H01L 51/441* (2013.01); *H01L 51/442* (2013.01); *H01L 51/0036* (2013.01); *H01L 51/0037* (2013.01); *H01L 51/0047* (2013.01); *H01L 51/0053* (2013.01); *H01L 51/4253* (2013.01); *Y02E 10/549* (2013.01)

(58) Field of Classification Search  
None  
See application file for complete search history.

(56) References Cited

U.S. PATENT DOCUMENTS

| 2005/0064309 A1 | 3/2005 | Itami |
| 2009/0315023 A1 | 12/2009 | Wallace et al. |
| 2010/0045176 A1 | 2/2010 | Kim et al. |
| 2014/0202517 A1* | 7/2014 | Kippelen ............... H01L 51/004 136/244 |

OTHER PUBLICATIONS

Rider et al. "Stable Inverted Polymer/Fullerene Solar Cells Using a Cationic Polythiophene Modified PEDOT:PSS Cathodic Interface", Article first published online: Jun. 21, 2010, Advanced Functional Materials vol. 20, Issue 15, pp. 2404-2415.*

(Continued)

*Primary Examiner* — Calvin Choi  
*Assistant Examiner* — Xiaoming Liu  
(74) *Attorney, Agent, or Firm* — Hicks & Associates; Mark P. Roach

(57) ABSTRACT

The present invention is directed to methods for tailoring the work function of electrodes in organic electronics using interfacial modifiers comprising functionalized semiconducting polymers and/or small molecules.

5 Claims, 6 Drawing Sheets

(56) References Cited

OTHER PUBLICATIONS

Kwong et al. "Influence of the device architecture to the ITO surface treatment effects", Feb. 6, 2004, Proc. SPIE 5215, Organic Photovoltaics IV, 153.*

Thompson, B. C.; Fréchet, J. M. Angew. Chem. Int. Ed. 2008, 47, 58-77.

Waldauf, C., Morana, M., Denk, P., Schilinsky, P., Coakley, K., Choulis, S.A., Brabec, C.J., Applied Physics Letters, 89 (23), 233517, (2006).

Glatthaar, M., Niggemann, M., Zimmermann, B., Lewer, P., Riede, M., Hinsch, A., Luther, J., Thin Solid Films, 491 (1-2), 298, (2005).

Şahin, Y., Alem, S., De Bettignies, R., Nunzi, J.-M., Thin Solid Films, 476, 340-343, (2005).

Zhao, D.W., Liu, P., Sun, X.W., Tan, S.T., Ke, L., Kyaw, A.K.K., Appl. Phys. Lett., 95(15), 153304, (2009).

Zimmermann, B., Wurfel, U., Niggemann, M., Sol. Ener. Mater. & Sol. Cells, 93, 491, (2009).

Blom, P. W. M.; Mihailetchi, V. D.; Koster, L. J. A.; Markov, D. E. Adv. Mater. 2007, 19, 1551-1566.

Lungenschmied, C.; Dennler, G.; Neugebauer, H.; Sariciftci, N. S.; Glatthaar, M.; Meyer, T.; Meyer, A. Sol. Energy Mater. Sol. Cells 2007, 91, 379-384.

Roman, L. S.; Mammo, W.; Pettersson, L. A. A.; Anderson, M. R.; Inganäs, O. Adv. Mater. 1998, 10, 774-777.

Liao, H.-H.; Chen, L.-M.; Xu, Z.; Li, G.; Yang, Y. Appl. Phys. Lett. 2008, 92, 173303.

White, M. S.; Olson, D. C.; Shaheen, S. E.; Kopidakis, N.; Ginley, D. S. Appl. Phys. Lett. 2006, 89, 143517-143519.

Ho, P. K. H.; Kim, J.-S.; Burroughes, J. H.; Becker, H.; Li, S. F. Y.; Brown, T. M.; Cacialli, F.; Friend, R. H. Nature 2000, 404, 481-484.

DeLongchamp, D. M.; Kastantin, M.; Hammond, P. T. Chem. Mater. 2003, 15, 1575-1586.

Huang, Y.; Yan, Y.; Smarsly, B. M.; Wei, Z.; Faul, C. F.J. J. Mater. Chem., 2009, 19, 2356-2362.

Rider et al., "Stable Inverted Polymer/Fullerene Solar Cells Using a Cationic Polythiophene Modified PEDOT:PSS Cathodic Interface", Advanced Functional Materials, vol. 20, Iss. 15, Jun. 21, 2010, pp. 2404-2415.

Chen, et al., "Finely Tailored Performance of Inverted Organic Photovoltaics through Layer-by-Layer Interfacial Engineering", ACS Applied Materials & Interfaces, vol. 3, No. 1, Sep. 28, 2011, pp. 3962-3970.

Brabec, "Organic photovoltaics: technology and market", Solar Energy Materials & Solar Cells, vol. 83, Iss. 2-3, Jun. 15, 2004, pp. 273-292.

Durstock et al., "Electrostatic self-assembly as a means to create organic photovoltaic devices", Synthetic Metals, vol. 116, Iss. 1-3, Jan. 1, 2001, pp. 373-377.

* cited by examiner

METHODS FOR TAILORING ELECTRODE WORK FUNCTION USING INTERFACIAL MODIFIERS FOR USE IN ORGANIC ELECTRONICS

CROSS REFERENCE TO RELATED APPLICATIONS

The present application is a national phase entry under 35 U.S.C. §371(f) of International Application PCT/CA2012/000614, filed Jun. 21, 2012, which claims priority to U.S. Provisional Patent Application No. 61/505,830, filed Jul. 8, 2011. Both of these patent applications are incorporated herein by reference in entirety.

FIELD OF THE INVENTION

The present invention is directed to methods for tailoring the work function of electrodes in organic electronics using interfacial modifiers comprising functionalized semiconducting polymers and/or small molecules.

BACKGROUND OF THE INVENTION

Inorganic photovoltaic devices tend to be expensive to manufacture and thus are generally not sufficiently cost-effective for widespread deployment as an alternate electricity producing method to conventional electricity production systems. In addition to the high cost, inorganic photovoltaic devices are typically heavy and brittle and require significant infrastructure for installation. As a result, purchasing inorganic photovoltaic devices requires a significant amount of time before the investment produces a return. Organic photovoltaic devices (OPVs) hold the potential to be much less expensive and include functional advantages such as colour tunability and the potential for flexible products. Despite the significant advantages of OPV technology, OPVs currently lack sufficient performance and stability for successful commercialization. As a result, there is a need for more efficient and lower cost organic photovoltaic systems.

OPVs typically operate by absorbing sunlight and creating energetic particles known as excitons. These excitons consist of strongly interacting pairs of electrons and holes, which are treated as single bound particles. In order to extract electrical energy from excitons, the excitons must first migrate to an interface that is capable of separating their component charges. Once separated, the electrons and holes are transported to electrodes where they are extracted from the photovoltaic device to produce an electrical current.

Polymer OPVs typically employ a two-component photoactive layer (PAL) consisting of an electron-donating conjugated polymer and an electron-accepting fullerene, structured in a disordered bicontinuous interpenetrating network known as the bulk heterojunction (BHJ). A widely researched polymer-based OPV device employs a photoactive BHJ of regioregular 2,5-diyl-poly(3-hexylthiophene) (P3HT) and [6,6]-phenyl-$C_{61}$-butyric acid methyl ester (PCBM). In this excitonic polymer OPV configuration, the absorption of light generates bound electron-hole pairs (i.e., excitons) that ideally dissociate into free charge carriers at the P3HT-PCBM (donor-acceptor) interface. Once the charge carriers are dissociated, they must migrate to the electrodes where they are collected and delivered as useful current.

In order to increase cell efficiency, interfacial modifiers (IMs) are applied at each of the electrodes, and these IMs reduce the energy required to extract charge carriers from the device. IMs that accomplish this task more effectively are expected to improve electrical current output, increase open-circuit voltage and render the devices more efficient. The use of IMs are therefore important to the fabrication of efficient organic electronic devices.

The most common IM used in organic electronics is sodium poly(3,4-ethylenedioxythiophene):poly(p-styrenesulfonate) [(PEDOT:PSS)$^-$Na$^+$]. (PEDOT:PSS)$^-$Na$^+$ is an organic polymer blend of cationic, conducting PEDOT that is charge over-compensated by anionic, insulating PSSNa. This polymer blend is usually applied in organic electronics as a hole collecting interfacial modification layer on indium tin oxide (ITO) due to its stable and high work function. A (PEDOT:PSS)$^-$Na$^+$ interfacial layer also leads to a smoother electrode with improved ohmic contact with the active layer, enhanced hole collection, increased open-circuit voltage ($V_{oc}$), as well as improved areal electrical uniformity in completed OPV devices. In fact, anionic (PEDOT:PSS)$^-$ has been deposited with cationic poly(p-xylene-α-tetrahydrothiophenium) using electrostatic layer-by-layer (LbL) assembly to modify ITO to control electron leakage in polymer light-emitting diodes.

Despite its ubiquity, PEDOT:PSS offers little in the way of control and/or tunability of the work function. In addition, it is known that PEDOT:PSS can contribute to the degradation of OLEDs and OPVs as a result of its high acidity which can promote ITO etching and mobile byproduct indium ions and an excess of PSSNa which can migrate throughout the BHJ and react with components of the photoactive layer. Finally, PEDOT:PSS is not applicable for modifying ITO for inverted solar cells. Operating a polymer BHJ OPV device in an "inverted mode" where electrons are extracted from the transparent electrode and holes from the reflective electrode, generally requires significant tailoring of the electrode work functions using interfacial modifiers, but is often advantageous with respect to performance stability, design flexibility, and compatibility with stacked and/or tandem architectures.

The work function value of electrodes in organic devices such as OPVs, organic light emitting diodes (OLEDs), capacitors, and organic thin film transistors (OTFTs) is important for the efficient transport and extraction of generated charges. If there is poor energy alignment between the work function of the electrode and the energy levels in the PAL, electrons and/or holes can be blocked limiting the amount of available current from the device. As such, the ability to tailor the work function of the electrodes is important in optimizing device fabrication. Although there are a number of IMs presently known that are capable of modifying the native work function of an electrode, they require various heating and annealing steps and fail to offer much control over the resulting work function. Typically, a large number of materials are synthesized and subsequently probed in order to determine the appropriate work function. This approach is timely and expensive with little guarantee of success.

The lifetime stability of OPVs is often limited and rigorous studies have identified several key degradation mechanisms such as photooxidation and morphology evolution in the structure of the multilayer device (1-4). Conventional donor polymers such as 2,5-diyl-poly[3-hexylthiophene)] (P3HT) are often prone to oxidation in air when illuminated, (5, 6) while a polymer with a deeper set highest occupied molecular orbital (HOMO) energy level is less prone to oxidation, and in turn contributes to an increased stability in the OPV (7, 8, 9-11). Additionally, interfacial buffer layers are known to affect the lifetime of OPVs (12). Specifically, the common hole transport interfacial modifier, PEDOT:PSS, can contribute to the degradation of organic light emitting diodes and OPVs as a result of: i) its high acidity which can promote ITO etching and mobile byproduct indium ions (13) and ii) an excess of poly(sodium 4-styrenesulfonate) (NaPSS) which can migrate throughout the bulk heterojunction (BHJ) and react with components of the photoactive layer (12).

Effective modulation of the electrode work function requires precise tuning of the interface between the electrode and the photoactive layer in OPVs. As such, there is a need for methods whereby the work function of the electrodes can be precisely tuned to match their energy levels with those in the PAL. In addition, there is a need to limit the amount of material required to reach a desired work function value.

To date, surface modification has been successfully demonstrated using only inorganic or surface-functionalized inorganic materials. The tailoring of the work function of ITO with purely organic polymer/small molecule coatings for organic electronic devices is largely unexplored and is attractive from several standpoints. For example, many organic polymers can be tailored to match the electronic, morphological and physical requirements for improved device performance. In addition, solution-processable polymers are desirable from an industrial perspective as costly vacuum deposition equipment is avoided, and in a further refinement, water-soluble polymers are particularly advantageous as organic solvents are relatively expensive and environmentally harmful. The quality and uniformity of polymer coatings is often higher than those of inorganic counterparts and the use of these coatings leads to improved mechanical flexibility and robustness of the overall device compared to devices made from inorganic materials. In addition, polymers are amenable to electrostatic multilayer approaches whereby nanoscale material can be deposited one layer-at-a-time in order to fabricate multilayer films of precise thickness. The electrostatic multilayer assembly of water-soluble interfacial modification polymers on electrode surfaces is therefore an attractive complement.

A variation in the structure of the same material, as opposed to testing a large number of potential compounds, would offer a powerful and efficient compliment to device optimization for organic electronics. A simple approach to electrode work function modulation, using only a few available materials, would allow a large number of PALs to be matched with the electrode.

A review of the prior art reveals various known polymers and multilayer fabrication methods used to affect the electronic properties of substrates. Buriak et al. (Adv. Funct. Mater. 2010, 20, 2404-2415) discloses the synthesis of a cationic and water-soluble polythiophene ([poly[3-(6-pyridiniumylhexyl)thiophene bromide]) and its use in hybrid coatings on indium tin oxide (ITO). Rubner et al. (Macromolecules 1997, 30, 2712-2716; J. Appl. Phys. 79 (10) 15 May 1996) discloses the fabrication of light-emitting diodes based on self-assembled multilayers of poly(phenylene vinylene) as well as multilayer fabrication using polyaniline. Friend et al. (Nature vol 404 Mar. 30, 2000, 481-494) discloses molecular-scale interface engineering for polymer light-emitting diodes using poly (p-phenylene vinylene) (PPV) and poly (p-xylylene-a-tetrahydrothiophenium) (PXT) along with PEDOT:PSS. Fermin et al. (Chem Phys Chem vol 5 Dec. 19, 2003, 571-575) discloses the change in work function that results from electrostatic layer-by-layer assembly of nanoparticles and polyelectrolytes. Hosono et al. (Physical Review B vol 83 2011 115435) teaches the change in work function of Nb doped $SrTiO_3$ substrates covered with MgO. Li et al. (J. Phys. Chem. B. vol 105 2001 10022-10028; J. Phys. Chem. B. vol 104 2000 11195-11201) teaches the change in surface electronic properties of self-assembled multilayers on conductive oxides as well as the change in electronic potentials of self-assembled monolayers utilizing metal phthalocyanine and oligomeric viologen on conductive substrates. Salaneck et al. (J. Phys. Chem. C, 2007, 111 (6), 2724-2729) discloses layer-by-layer deposition of copper phthalocyanine from aqueous solution and the resulting electronic structure. Electrostatic layer-by-layer (eLbL) self assembly of the small molecule $PTCDI^+$ with anionic surfactants or polyelectrolytes has been demonstrated in several papers (Langmuir vol 25 2009 1188-1195; J. Mater. Chem., vol 19 2009 2356-2362; Langmuir vol 24 2008 43-48; Adv. Funct. Mater. vol 18 2008 1890-1897.

SUMMARY OF THE INVENTION

In accordance with a first embodiment, the invention provides a method of tailoring the work function of an electrode to a desired work function value for use in an organic device comprising the steps of:
a. selecting a first functionalized semiconducting polymer (FSP) for an electrode based on known work function values obtained from a library of established work function values for electrode/FSP pairs;
b. coating an electrode with a first solution containing the selected FSP and rinsing to form a first half bi-layer;
c. measuring the work function of the first half bilayer to obtain a first work function value;
d. comparing the first work function value to the desired work function value;
e. coating the first half bilayer with $PEDOT:PSS^-$ to form a first bilayer;
f. measuring the work function of the first bilayer to obtain a first bilayer work function value;
g. repeating steps a-f until the desired work function value is obtained.

In further embodiments, the functionalized semiconducting polymer (FSP) is P3(CNP)HT, P3(TBP)HT or P3PHT.

In another embodiment, the number of bilayers is at least two having at least two different FSPs and/or the FSP is changed with each repetition of steps a-c.

In another embodiment, the electrode includes a combination of at least one small molecule and at least one FSP.

In another aspect, the invention provides a method of tailoring the work function of an electrode to a desired work function value for use in an organic device comprising the steps of:
a. selecting a first small molecule for an electrode based on known work function values obtained from a library of established work function values for electrode/small molecule pairs;
b. coating an electrode with a first solution containing the selected small molecule and rinsing to form a first half bi-layer;
c. measuring the work function of the first half bilayer to obtain a first work function value;
d. comparing the first work function value to the desired work function value;
e. coating the first half bilayer with $PEDOT:PSS^-$ to form a first bilayer;
f. measuring the work function of the first bilayer to obtain a first bilayer work function value;
g. repeating steps a-f until the desired work function value is obtained.

In further embodiments, the small molecules are selected from one of the following:

N,N'-Bis(2-(trimethylammonium)ethylene)perylene-3,4,9,10-tetracarboxydiimide iodide (PTCDI), N'N'-Bis(2-trimethylammonium)ethylene)naphthalene-1,4,5,8-tetracarboxyldiimide iodide (NTCDI), sodium N,N'-bis(3-sulfonatopropyl)naphthalene-1,4,5,8-tetracarboxylic diimide (NTCDIS) and sodium N,N'-bis(3-sulfonatopropyl)perylene-3,4,9,10-tetracarboxylic diimide (PTCDIS).

BRIEF DESCRIPTION OF THE DRAWINGS

The invention is described with reference to the drawings in which.

DETAILED DESCRIPTION OF THE INVENTION

Figure 1:
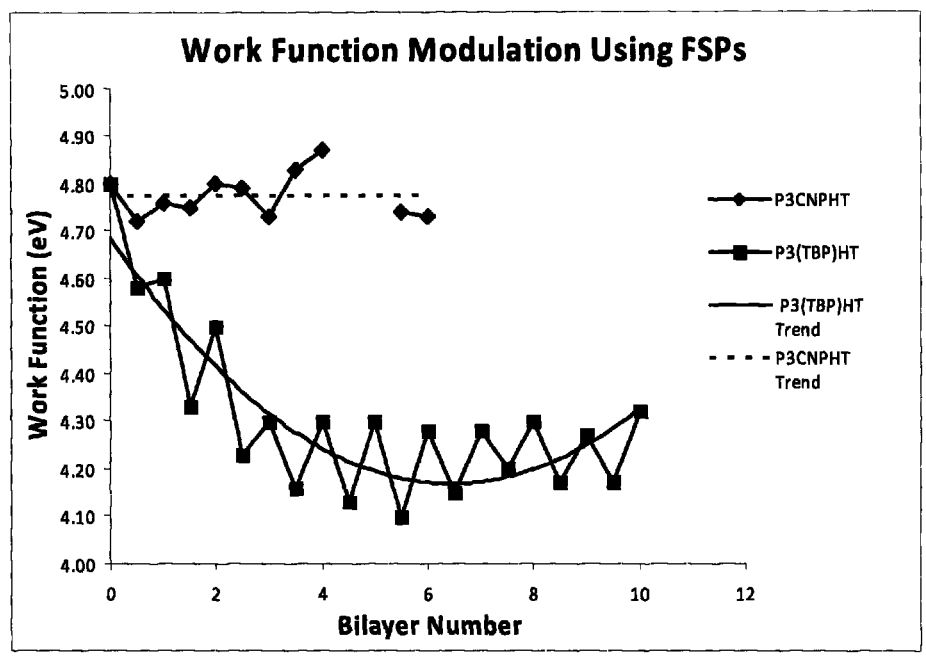
FIG. 1 is a graph showing the change in work function with bilayer number using P3(TBP)HT and P3(CNP)HT functionalized semiconducting polymers (FSPs).

The invention relates to methods for controlling the work function of electrodes in organic devices using layer-by-layer (LbL) deposition of functionalized semiconducting polymers (FSPs) and/or small molecules. When describing the present invention, all terms not defined herein have their common art-recognized meanings. To the extent that the following description is of a specific embodiment or a particular use of the invention, it is intended to be illustrative only, and not limiting of the claimed invention. The following description is intended to cover all alternatives, modifications and equivalents that are included in the spirit and scope of the invention, as defined in the appended claims.

In accordance with one aspect of the invention, the combination of the FSPs and/or small molecules with PEDOT:PSS⁻ using LbL assembly is used to tailor the work function of electrodes used in organic electronics devices. Useful FSPs include those disclosed in a PCT Application filed Jun. 21, 2011 entitled "Functionalized Semiconducting Polymers For Use In Organic Photovoltaic Devices" (Buriak et al.) incorporated herein by reference.

More specifically, the invention describes a method of forming multilayers of FSPs and PEDOT:PSS⁻ using electrostatic layer-by-layer (LbL) assembly in order to form electrodes with a desired work function. The general structure of the FSPs includes a semiconducting polymer backbone, a linker chain, and a cationic terminal group (CTG) rendering the FSP soluble in aqueous solutions. The functionalized semiconducting polymers generally have the following generalized structure:

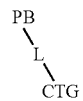

wherein PB is a polymer backbone selected from a number of semiconducting polymers, L is an alkyl, elkenyl or alkoxy chain of varying length and CTG is a cationic terminal group providing a net positive charge in aqueous solutions.

The cationic charge on the FSP allows the FSP to be used in an electrostatic layer-by-layer (LbL) assembly process for forming thin films. The method includes a first step involving coating an electrode with a first solution containing an FSP or variations thereof and rinsing the electrode to form a first half bilayer. The first half bilayer includes the cationic FSP electrostatically bound to the surface of the electrode. A second step involves measuring a first work function value for the first half bilayer. The first work function value is compared to the desired work function value to assess the nearness between these two values. If the first measured work function value does not match the desired work function value, the first half bilayer is coated with PEDOT:PSS⁻ using LbL to form a first complete bilayer. The work function of the coated electrode is again measured and compared to the desired work function value. The steps are repeated until the desired work function value is obtained. By utilizing a library of work function values measured from different FSPs, the designer is able to select those FSPs that are more likely to result in a desired work function value with a minimum number of half bilayers or bilayers.

On exposure of the electrode surface to an aqueous solution of FSP⁺, the cationic polymer electrostatically binds to the ITO surface. Due to charge overcompensation by FSP⁺, the rinsed platform becomes positively charged and, consequently, strongly associates with the PEDOT:PSS⁻ in the subsequent immersion step. Following a thorough rinse to remove physisorbed material as well as the electrostatic binding byproduct, NaBr, the formation of the first FSP/PEDOT:PSS bilayer is complete. Due to charge overcompensation, the surface bears overall net negative charge permitting the formation of subsequent bilayers by further reiterating the cycle depicted in route (i) in FIG. 3. For n repeats of the LbL cycle, an (FSP/PEDOT:PSS)$_n$ multilayer film of n bilayers is produced. It is unlikely that each bilayer corresponds to a distinct layer system with abrupt interfaces but rather a disordered interpenetrating network of polymeric components as shown schematically in FIG. 4, where the dashed lines show the boundaries between bilayers.

Work functions can be measured using a number of available techniques including ultraviolet photoelectron spectroscopy (UPS) and x-ray photoelectron spectroscopy (XPS). A plot of work function values versus bilayer number illustrates a trend for each FSP (for examples see FIGS. 1 and 2). Using the established trend for each FSP, the appropriate FSP can be chosen to achieve a desired work function value.

By way of example, FIG. 1 shows the change in work function value for an ITO electrode for 2 FSPs with increasing bilayer number. For P3(CNP)HT, the work function oscillates between 4.7-4.9 eV. For P3(TBP)HT, the work function begins at ~4.8 eV and tends towards a plateau at ~4.1 eV. The work function of an electrode can therefore be tailored using a single material, changing only the number of bilayers of the IM.

Figure 2:
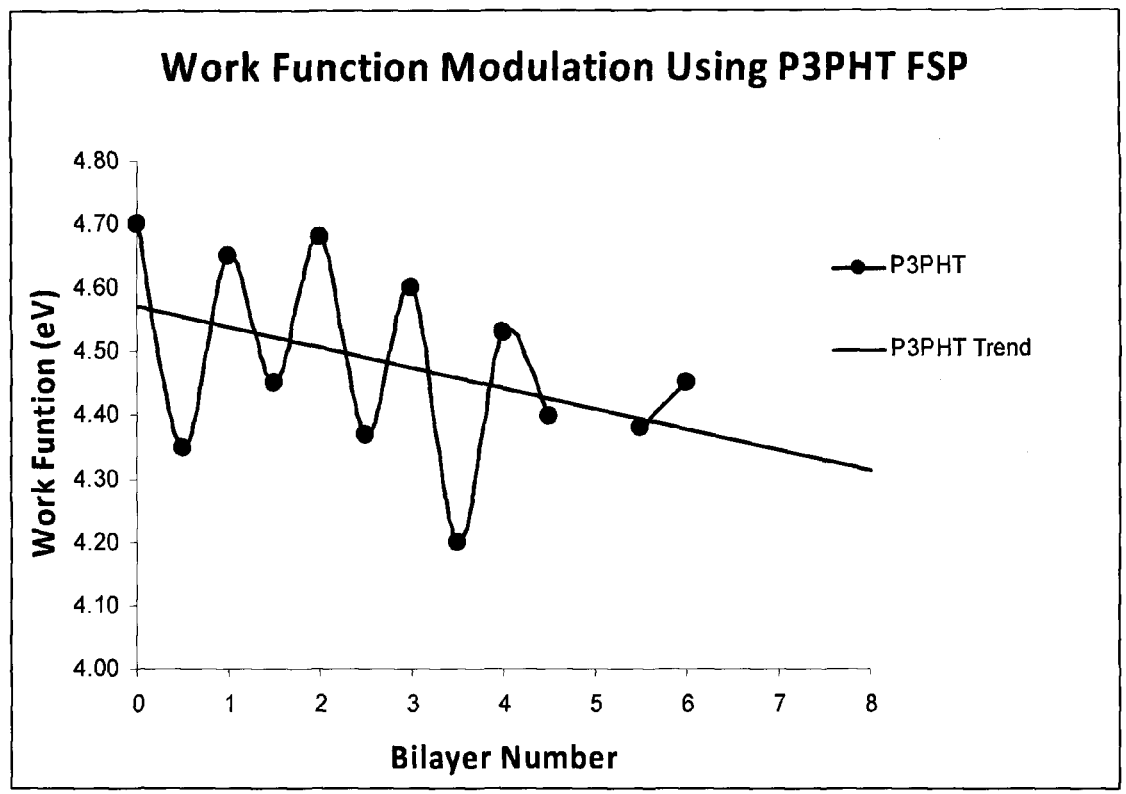
FIG. 2 is a graph showing the change in work function with bilayer number using the P3PHT functionalized semiconducting polymer (FSP).

In accordance with one embodiment of the invention, the LbL method is applied using the FSP P3(TBP)HT to tailor the electrode work function with increasing bilayer number (FIG. 1). Bare ITO has a work function value of approximately 4.8 eV. In many cases, the bare ITO work function value is too high to form a proper electrode in organic electronics devices. In order to lower the work function value, and minimize energetic barriers between the ITO and the PAL, a first half bilayer is applied using the LbL method. At one half bilayer, a film of P3(TBP)HT measures a work function value of approximately 4.58 eV. FIG. 1 shows the expected trend for this material. As the number of bilayers increases, the measured work function value decreases until a value of approximately 4.1 eV is measured. This value remains with increasing bilayer number. As shown in FIGS. 1 and 2, the work function value oscillates as the outermost layer of the film changes between the FSP and PEDOT:PSS$^-$.

In another aspect of the invention, the FSP P3(CNP)HT is used to tailor the work function of the electrode. As shown in FIG. 1, the work function varies in the range of 4.7-4.9 eV with increasing number of bilayers. Slight changes in work function can have significant affects on device performance and thus by utilizing observed trends in work function values for different FSPs allows for efficient optimization of overall device design.

In another embodiment of the invention, increasing the thickness while maintaining the work function value can be advantageous with respect to film uniformity. As the number of bilayers in the FSP/PEDOT:PSS$^-$ film increases, better film uniformity is expected. Pin holes or variations in film topography can compromise device performance. As such, an increase in the number of layers in the film is expected to increase film quality and a range of bilayer numbers/film thicknesses are available for a given work function in the regions of the curves where the work function values remain relatively constant.

In another embodiment of the invention, the first half bilayer is deposited onto the electrode for a number of FSPs in order to establish a number of first work function values (i.e a library of work function values). From these initial data, the best FSP for a particular PAL can be selected with the knowledge that the expected range of available work functions and film thicknesses will be available based on the expected trends. In other words, the designer, by utilizing the library of values, can minimize the number of test/research trials that may otherwise be required to establish a desired work function value.

In another embodiment, more than one FSP may be chosen for the multilayer film. Upon completion of the first bilayer with a first FSP, a second and different FSP can be chosen to begin the second half bilayer of the film. A large number of multilayer structures with varying compositions can thus be fabricated leading to a variety of work function values with distinct film characteristics. This dramatically increases the number of potential work functions of an electrode that can be used to match the energy levels between the electrode and the PAL of organic electronics devices.

In yet another embodiment, the FSP P3PHT is used to form multilayer films of FSP/PEDOT:PSS$^-$ (FIG. 2). The range of work function values for this FSP is 4.2-4.7 eV. The general trend is a decrease in work function values with increasing number of bilayer numbers. As described above, this information can be used as a potential predictor of work function value in the design of a specific electrode.

In another aspect of the invention, small molecules can be used in place of the FSPs. Small molecules that can be used include N,N'-Bis(2-(trimethylammonium)ethylene) perylene-3,4,9,10-tetracarboxydiimide iodide (PTCDI; A), N'N'-Bis(2-trimethylammonium)ethylene)naphthalene-1,4, 5,8-tetracarboxyldiimide iodide (NTCDI; B), sodium N,N'-bis(3-sulfonatopropyl)naphthalene-1,4,5,8-tetracarboxylic diimide (NTCDIS; C) and sodium N,N'-bis(3-sulfonatopropyl)perylene-3,4,9,10-tetracarboxylic diimide (PTCDIS; D).

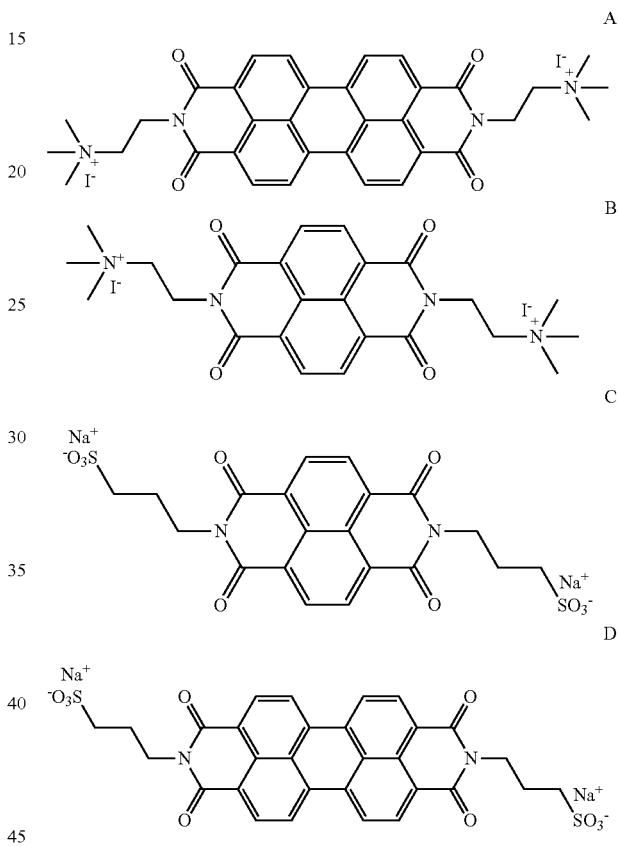

Figure 3:
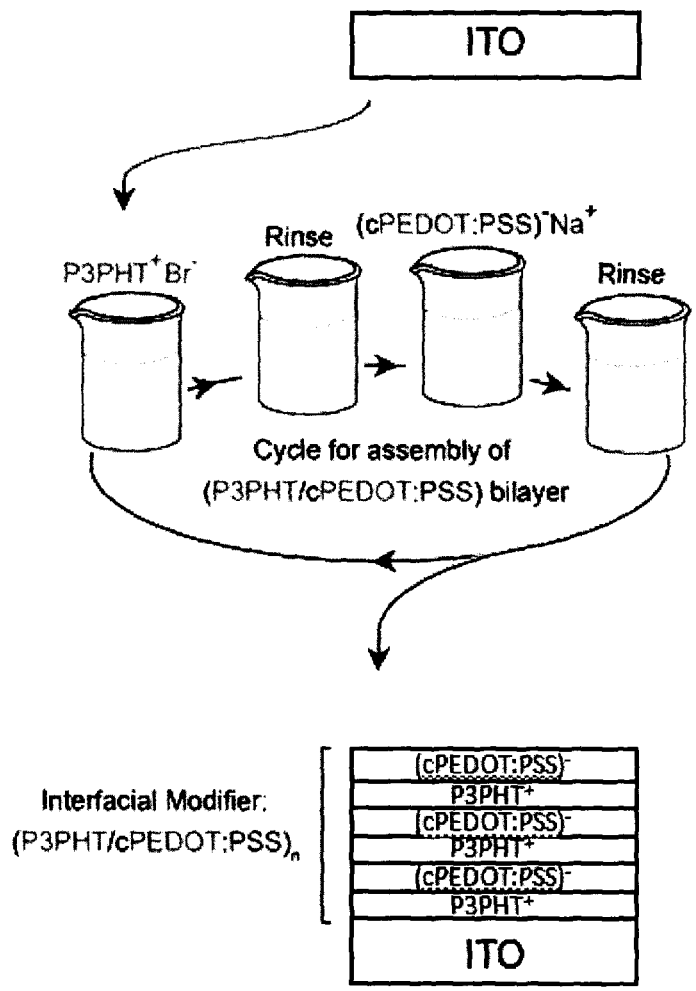
FIG. 3 is a schematic showing the LbL method using a combination of an FSP and colloidal PEDOT:PSS⁻Na⁺ (cPEDOT).
Figure 4:
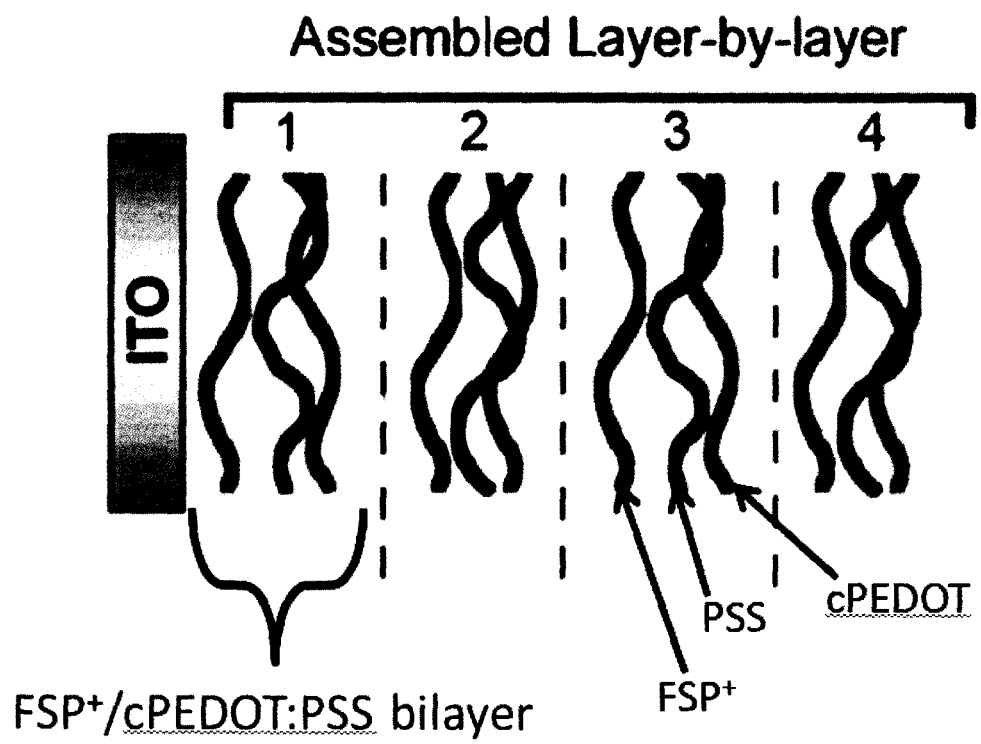
FIG. 4 is a drawing depicting a multilayer thin film fabricated using the LbL method with an FSP and colloidal PEDOT (cPEDOT).
Figure 5:
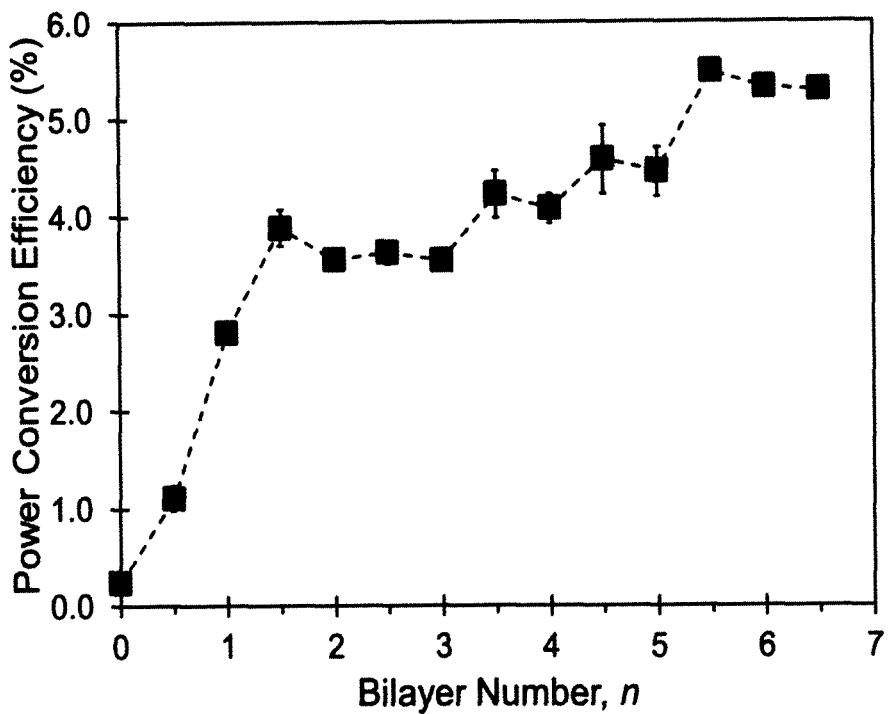
FIG. 5 shows the power conversion efficiency (PCE) versus bilayer number for an organic photovoltaic device with P3(TBP)HT:PEDOT:PSS as the interfacial modifier.
Figure 6:
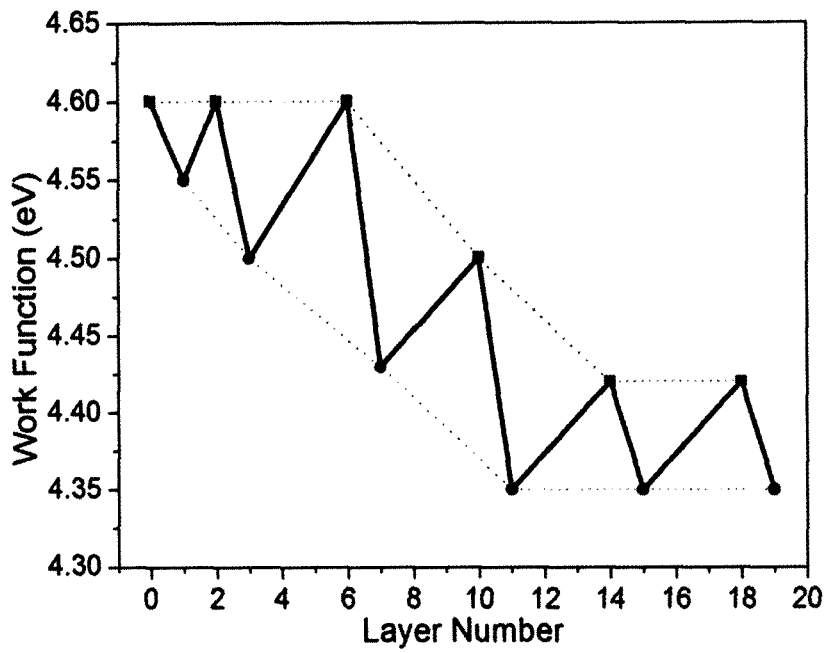
FIG. 6 shows the change in work function with bilayer number for a multilayer film formed using the small molecule PTCDI⁺ along with (PEDOT:PSS⁻)-
Figure 7:
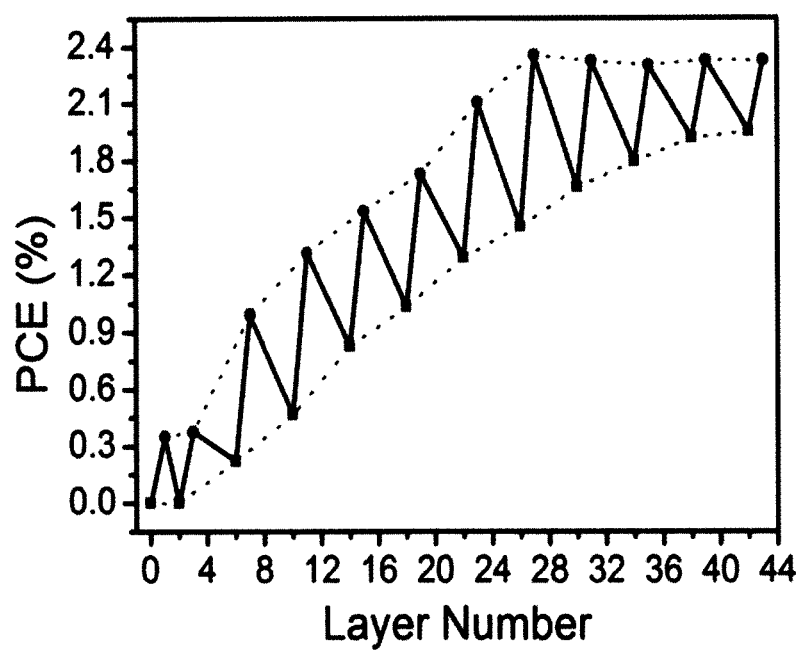
FIG. 7 shows the power conversion efficiency (PCE) versus bilayer number for an organic photovoltaic device with the small molecule PTCDI⁺ along with (PEDOT:PSS⁻)- as the interfacial modifier.

In a specific embodiment, the small molecule PTCDI is used to tailor the work function of the electrode. Given the positive charges residing on the two ammonium groups in PTCDI, the small molecule is amenable to electrostatic layer-by-layer deposition. LbL hybrid films of PTCDI$^+$ and PEDOT:PSS$^-$ are obtained via sequential dip coating as depicted in FIG. 3. After air plasma treatment, the freshly-cleaned ITO substrate, which bears an inherent negative charge, is immersed in aqueous (PTCDI$^+$)I$^-$ solution for 5 minutes and then rinsed thoroughly with deionized water, followed by immersion in an aqueous (PEDOT:PSS$^-$)Na$^+$ solution for 5 minutes. The PTCDI$^+$ molecule has a net positive charge, and the PEDOT:PSS$^-$ has a net negative charge, and thus alternation of the immersion steps between cationic and anionic materials leads to the controlled build up of PTCDI$^+$:(PEDOT:PSS$^-$) multilayers. The byproduct, NaI, is water soluble and is removed during the rinse steps. An arbitrary number of layers can be built up by performing the required number of immersion steps in order to reach the desired work function. FIG. 5 shows the power conversion efficiency (PCE) versus bilayer number for an organic photovoltaic device with P3(TBP)HT:PEDOT:PSS as the interfacial modifier. As can be seen, device performance is highly sensitive to the number of interfacial modifier layers in the device. As the number of layers changes, the modulation of work function has an influence on the overall device performance. In FIG. 6, the change in work function with bilayer number for a multilayer film formed using the small molecule PTCDI$^+$ along with (PEDOT:PSS$^-$) is shown and in FIG. 7 the power conversion efficiency (PCE) versus bilayer number for an organic photovoltaic device with the small molecule PTCDI$^+$ along with (PEDOT: PSS$^-$)- as the interfacial modifier is shown. It can be seen that there is an oscillation in both the work function value and the PCE of the tested device.

Thus, the invention enables the electrode designer to create a electrode having a desired work function. For example, an electrode designer may wish to create an electrode having a work function of 4.5 eV with a maximum power conversion efficiency. In this case the designer could compare the starting work functions of their electrode (e.g., indium tin oxide, aluminum, gold, silver, etc. . . . ) to a library of FSP work functions for electrode material. An FSP would then be selected which has a work function less than or equal to the desired work function, in this example, 4.5 eV. Then the designer can deposit bilayers films on the electrode until the desired work function is obtained. Thus, the library of established work function values for electrode/FSP pairs preferably includes multiple bi-layer work function data for a plurality of different electrode materials and an FSP.

The following representative examples describe the creation and testing of electrodes in accordance with the invention.

Example 1

Preparation of (FSP/PEDOT:PSS)$_n$ Coated ITO Substrates

For the deposition of FSP/cPEDOT:PSS bilayers on ITO, an LbL method in air may be used. Freshly cleaned ITO substrates are first immersed in a 95:5 (v/v) H$_2$O:DMF solution of FSP$^-$Br$^+$ for 5 min, rinsed with deionized water, then transferred to a 0.8 wt % aqueous solution of (PEDOT:PSS)$^-$Na$^+$ for 5 min. Rinsing with deionized water completes one bilayer formation cycle. After performing a chosen number of cycles, completed films are spin dried at 3000 rpm for 60 s.

Example 2

Small Molecule Synthesis (PTCDI$^+$)I$^-$ was synthesized according to literature procedures (14) and as expected, the material is soluble in water, producing a red aqueous solution.

Example 3

Preparation of PTCDI$^+$:(PEDOT:PSS) Composite Films

All PTCDI$^+$:(PEDOT:PSS$^-$) composite films were formed by aqueous eLbL deposition. Freshly cleaned and plasma treated ITO coated glass was first immersed in 0.5 mg/mL aqueous solution of (PTCDI$^+$)I$^-$ for 5 minutes, rinsed with deionized water, then transferred to a 0.8 wt % aqueous solution of (PEDOT:PSS$^-$)Na$^+$ for 5 minutes. Rinsing with deionized water completes one bilayer formation cycle. The substrate was dipped in modifying solutions n times to build up the desired multilayer film with layer number n. Finally, samples were spin dried at 3000 rpm in air for 60 s.

Example 4

Work Function Modulation

The work functions of the [FSP:PEDOT:PSS]n films were measured by ultraviolet photoelectron spectroscopy (UPS) (He I line, hv=21.2 eV). As an example, FIG. 1 shows the work function values with increasing bilayers for the FSP P3(TBP)HT. The unmodified ITO work function (n=0) was 4.80 eV. After the deposition of the FSP n=0.5 layer, the work function decreased to 4.58 eV followed by an increase to 4.60 eV after completing the first bilayer (n=1) with subsequent PEDOT:PSS functionalization. A decrease in work function from 0 to 3 bilayers was then observed, and this is presumed to arise from the decreasing influence of the ITO substrate on the measurement (the penetration depth of UPS ~2-5 nm).

Example 5

FSP Device Fabrication and Testing

OPV devices consisted of the following architecture: ITO/[FSP:PEDOT:PSS]$_n$/PBDTTPD:PC$_{71}$BM/V$_2$O$_5$/Al. The cathodic buffer layer consisted of eLbL assembled [FSP:PEDOT:PSS]$_n$ multilayer films on freshly cleaned ITO coated glass substrates as described above. The photoactive layer was low band gap PBDTTPD and PC$_{71}$BM mixed in a bulk heterojunction (BHJ). The photoactive layer solution was prepared under an inert environment where separate solutions of PBDTTPD and PC$_{71}$BM in o-DCB were stirred at 80° C. for 8 hours then mixed in a 1:1.5 PBDTTPD:PC$_{71}$BM ratio. This formed a 15 mg/mL solution, which was left to stir at 80° C. for 2 hours. A heated spin casting method was used to coat the photoactive layer. The eLbL-modified ITO substrates and the PBDTTPD:PC$_{71}$BM solution were heated to 90° C. in air, and pipette tips were heated to 80° C. Immediately before coating, a heated ITO/[FSP:PEDOT:PSS]$_n$ substrate was transferred to the spin-coated chuck. 100 µL of the photoactive layer solution was quickly dispensed and spin-cast at 600 rpm for 1 min in air, forming a ~90 nm thick layer as determined with optical profilometry. The films were covered with a Petri dish and stored in air and darkness for 18 hours. After which, a 20 nm V$_2$O$_5$ hole transport layer and 80-100 nm aluminum anode were thermally evaporated at ~5 Å s$^{-1}$ under high vacuum (~10$^{-4}$ Pa) defining a device area of 0.155±0.008 cm$^2$. The PV characteristics of the OPV devices were characterized at 25-30° C. in air under simulated AM1.5 G conditions (xenon source from Oriel 91191 1000 W) and calibrated to a certified Si reference cell with a KG-5 filter (PV Measurements, PVM624). J-V characteristics were recorded using a computer-controlled Keithley 2400 source meter. Three devices were average for each data point.

Example 6

Small Molecule (SM) Device Fabrication and Testing

P3HT (23 mg) and PCBM (23 mg) were separately dissolved in 0.5 mL of o-dichlorobenzene and stirred at 65°

C. in an inert atmosphere glovebox overnight. They were then mixed together and further stirred for 2 hours in the glovebox. The P3HT:PCBM solution was then filtered through 0.2 μm PTFE filters, spin coated at 600 rpm for 60 s on the SM:(PEDOT:PSS⁻)-coated electrodes, and finally dried in a covered Petri dish for 20 minutes. 20 nm of $V_2O_5$ (Sigma-Aldrich, 99.99%) and 80 nm of Al (Kurt J. Lesker, 99.99%) were thermally evaporated under high vacuum conditions (~$10^{-4}$ Pa) to form complete devices with active areas of 0.2 cm² (see Figure S32). The current-voltage characteristics of completed solar cells were measured using a Keithley 2400 Source Meter, both in the dark and irradiated with a simulated AM 1.5 G spectrum in an Oriel 91191 1000 W xenon solar simulator. The solar simulator irradiance was calibrated against an NREL-certified Si reference cell with a PV Measurements, Inc. KG-5 filter (model PVM 624). The irradiance in the range 200 nm to 20 μm was 140 mW/cm². In the range 200 nm to 1360 nm, the irradiance was 130 mW/cm², and between 300 nm to 700 nm, the irradiance was 40 mW/cm². To test the stability of OPV devices, freshly made devices were tested and stored in air and darkness for 128 days according to the ISOS-D-1 protocol.

Example 6

Preparation of SM:(PEDOT:PSS⁻) Composite Films

All SM:(PEDOT:PSS⁻)-coated substrates were formed by aqueous eLbL deposition, as the freshly cleaned electrode substrates were alternatively dip coated in 0.5 mg/mL aqueous solution of the small molecule and an aqueous solution of (PEDOT:PSS⁻)Na⁺. The duration of each immersion was 5 minutes, and after every immersion, samples were rinsed with deionized water to wash away excess solution. The sample was dipped in modifying solutions n times to build up the desired multilayer film with layer number n, then spin dried at 3000 rpm for 60 s, and stored in a nitrogen-purged chamber overnight.

As will be apparent to those skilled in the art, various modifications, adaptations and variations of the foregoing specific disclosure can be made without departing from the scope of the invention claimed herein.

REFERENCES

1) Thompson, B. C.; Fréchet, J. M. Angew. Chem. Int. Ed. 2008, 47, 58-77.
2) Waldauf, C., Morana, M., Denk, P., Schilinsky, P., Coakley, K., Choulis, S. A., Brabec, C. J., Applied Physics Letters, 89(23), 233517, (2006).
3) Glatthaar, M., Niggemann, M., Zimmermann, B., Lewer, P., Riede, M., Hinsch, A., Luther, J., Thin Solid Films, 491(1-2), 298, (2005).
4) Sahin, Y., Alem, S., De Bettignies, R., Nunzi, J.-M., Thin Solid Films, 476, 340-343, (2005).
5) Zhao, D. W., Liu, P., Sun, X. W., Tan, S. T., Ke, L., Kyaw, A. K. K., Appl. Phys. Lett., 95(15), 153304, (2009).
6) Zimmermann, B., Wurfel, U., Niggemann, M., Sol. Ener. Mater. & Sol. Cells, 93, 491, (2009).
7) Blom, P. W. M.; Mihailetchi, V. D.; Koster, L. J. A.; Markov, D. E. Adv. Mater. 2007, 19, 1551-1566.
8) Lungenschmied, C.; Dennler, G.; Neugebauer, H.; Sariciftci, N. S.; Glatthaar, M.; Meyer, T.; Meyer, A. Sol. Energy Mater. Sol. Cells 2007, 91, 379-384.
9) Roman, L. S.; Mammo, W.; Pettersson, L. A. A.; Anderson, M. R.; Inganäs, O. Adv. Mater. 1998, 10, 774-777.
10) Liao, H.-H.; Chen, L.-M.; Xu, Z.; Li, G.; Yang, Y. Appl. Phys. Lett. 2008, 92, 173303.
11) White, M. S.; Olson, D. C.; Shaheen, S. E.; Kopidakis, N.; Ginley, D. S. Appl. Phys. Lett. 2006, 89, 143517-143519.
12) Ho, P. K. H.; Kim, J.-S.; Burroughes, J. H.; Becker, H.; Li, S. F. Y.; Brown, T. M.; Cacialli, F.; Friend, R. H. Nature 2000, 404, 481-484.
13) DeLongchamp, D. M.; Kastantin, M.; Hammond, P. T. Chem. Mater. 2003, 15, 1575-1586.
14) Huang, Y.; Yan, Y.; Smarsly, B. M.; Wei, Z.; Faul, C. F. J. J. Mater. Chem., 2009, 19, 2356-2362.

The invention claimed is:

1. A method of tailoring the work function of an electrode to a desired work function value for use in an organic photovoltaic device comprising the steps of:
   a. selecting a small molecule for an electrode based on known work function values obtained from a library of established work function values for electrode/small molecule pairs;
   b. coating an electrode with a solution containing the selected small molecule and rinsing to form a half bilayer;
   c. measuring the work function of the half bilayer to obtain a work function value;
   d. comparing the work function value to the desired work function value;
   e. coating the half bilayer with PEDOT:PSS to form a bilayer;
   f. measuring the work function of the bilayer to obtain a bilayer work function value; and
   g. repeating steps a-f using a different small molecule in each successive cycle of steps a-f until the desired work function value is obtained.

2. The method as in claim 1 wherein each successive cycle of steps a-f includes at least one cycle of steps a-f, thereby producing at least two bilayers with at least two different small molecules.

3. The method as in claim 1 wherein the small molecules are selected from one of the following:
   N,N'-Bis(2-(trimethylammonium)ethylene)perylene-3,4,9,10-tetracarboxydiimide iodide (PTCDI), N'N'-Bis(2-trimethylammonium)ethylene)naphthalene-1,4,5,8-tetracarboxyldiimide iodide (NTCDI), sodium N,N'-bis(3-sulfonatopropyl)naphthalene-1,4,5,8-tetracarboxylic diimide (NTCDIS) and sodium N,N'-bis(3-sulfonatopropyl)perylene-3,4,9,10-tetracarboxylic diimide (PTCDIS).

4. The method as in claim 1 wherein the library of established work function values for electrode/small molecule pairs includes multiple bi-layer work function data for a plurality of different electrode materials and an a small molecule.

5. The method as in claim 4 wherein the electrode materials are selected from indium tin oxide, gold, aluminium, and silver.

* * * * *